United States Patent
Nemoto et al.

(10) Patent No.: US 9,875,962 B2
(45) Date of Patent: Jan. 23, 2018

(54) SENSOR DEVICE HAVING INDUCTORS, ANALOG AND LOGIC CIRCUITS FOR DETECTING POWER FLOWING THROUGH A POWERLINE

(71) Applicant: Renesas Electronics Corporation, Tokyo (JP)

(72) Inventors: Takatsugu Nemoto, Tokyo (JP); Yasutaka Nakashiba, Tokyo (JP); Takasuke Hashimoto, Tokyo (JP); Shinichi Uchida, Tokyo (JP); Kazunori Go, Kanagawa (JP); Hiroshi Oe, Saitama (JP); Noriko Yoshikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/456,976

(22) Filed: Mar. 13, 2017

(65) Prior Publication Data

US 2017/0186689 A1    Jun. 29, 2017

Related U.S. Application Data

(63) Continuation of application No. 14/475,623, filed on Sep. 3, 2014, now Pat. No. 9,632,119.

(30) Foreign Application Priority Data

Sep. 5, 2013  (JP) .................................. 2013-184208

(51) Int. Cl.
*G01R 33/06* (2006.01)
*H01L 23/522* (2006.01)
(Continued)

(52) U.S. Cl.
CPC ...... *H01L 23/5227* (2013.01); *G01R 31/2607* (2013.01); *G01R 33/06* (2013.01);
(Continued)

(58) Field of Classification Search
CPC . G01R 31/2607; G01R 33/06; H01F 27/2804; H01L 23/5227; H01L 23/5286; H01L 28/10
(Continued)

(56) References Cited

U.S. PATENT DOCUMENTS 4,011,505 A   3/1977  Spalding
4,039,942 A   8/1977  Glaser
(Continued)

FOREIGN PATENT DOCUMENTS

JP    61-053760 A    3/1986
JP    2000-174357 A  6/2000
(Continued)

OTHER PUBLICATIONS

Office Action, dated Aug. 1, 2017, in Japanese Patent Application No. 2013-184208.
(Continued)

*Primary Examiner* — Jay Patidar
(74) *Attorney, Agent, or Firm* — Shapiro, Gabor and Rosenberger, PLLC

(57) ABSTRACT

A sensor device includes a power line and a semiconductor device. The semiconductor device includes an inductor. The inductor is formed using an interconnect layer (to be described later using FIG. 3). The power line and the semiconductor device overlap each other when viewed from a direction perpendicular to the semiconductor device. The semiconductor device includes two inductors. The power line extends between the two inductors when viewed from a direction perpendicular to the semiconductor device.

6 Claims, 24 Drawing Sheets

(51) Int. Cl.
  *H01F 27/28* (2006.01)
  *H01L 49/02* (2006.01)
  *H01L 23/528* (2006.01)
  *G01R 31/26* (2014.01)

(52) U.S. Cl.
  CPC ..... *H01F 27/2804* (2013.01); *H01L 23/5286* (2013.01); *H01L 28/10* (2013.01)

(58) Field of Classification Search
  USPC .......................................... 324/116–126, 252
  See application file for complete search history.

(56) References Cited

U.S. PATENT DOCUMENTS

| | | | |
|---|---|---|---|
| 4,378,525 | A | 3/1983 | Burdick |
| 5,933,003 | A | 8/1999 | Hebing et al. |
| 7,990,132 | B2 | 8/2011 | Dupuis et al. |
| 8,330,453 | B2 * | 12/2012 | Hotz .................... G01R 15/207 |
| | | | 324/117 H |
| 8,779,756 | B2 | 7/2014 | Nomura |
| 8,878,520 | B2 | 11/2014 | Tamura |
| 2004/0257061 | A1 | 12/2004 | George de Buda |
| 2005/0073292 | A1 | 4/2005 | Hastings et al. |
| 2005/0073293 | A1 | 4/2005 | Hastings et al. |
| 2005/0073295 | A1 | 4/2005 | Hastings et al. |
| 2006/0284613 | A1 | 12/2006 | Hastings et al. |
| 2008/0084201 | A1 | 4/2008 | Kojori |
| 2008/0185685 | A1 | 8/2008 | Nakashiba |
| 2009/0001962 | A1 | 1/2009 | Dupuis et al. |
| 2009/0121704 | A1 | 5/2009 | Shibahara |
| 2009/0284248 | A1 | 11/2009 | Etter et al. |
| 2010/0207603 | A1 | 8/2010 | McNulty et al. |
| 2011/0101958 | A1 | 5/2011 | Morimoto |
| 2012/0146620 | A1 | 6/2012 | Dames et al. |
| 2012/0168901 | A1 * | 7/2012 | Santangelo ............. H01L 23/48 |
| | | | 257/531 |
| 2013/0008022 | A1 | 1/2013 | Yao et al. |
| 2013/0015839 | A1 | 1/2013 | Franke |
| 2013/0106412 | A1 | 5/2013 | Nomura et al. |
| 2014/0167736 | A1 | 6/2014 | Suzuki et al. |

FOREIGN PATENT DOCUMENTS

| | | |
|---|---|---|
| JP | 2001-066327 A | 3/2001 |
| JP | 2006-071457 A | 3/2006 |
| JP | 2010-266290 A | 11/2010 |
| JP | 2011-185914 A | 9/2011 |

OTHER PUBLICATIONS

Extended European Search Report, dated Jan. 23, 2015, in European Patent Application No. 14182082.9.

Office Action dated Jan. 31, 2017, in Japanese Patent Application No. 2013-184208.

* cited by examiner

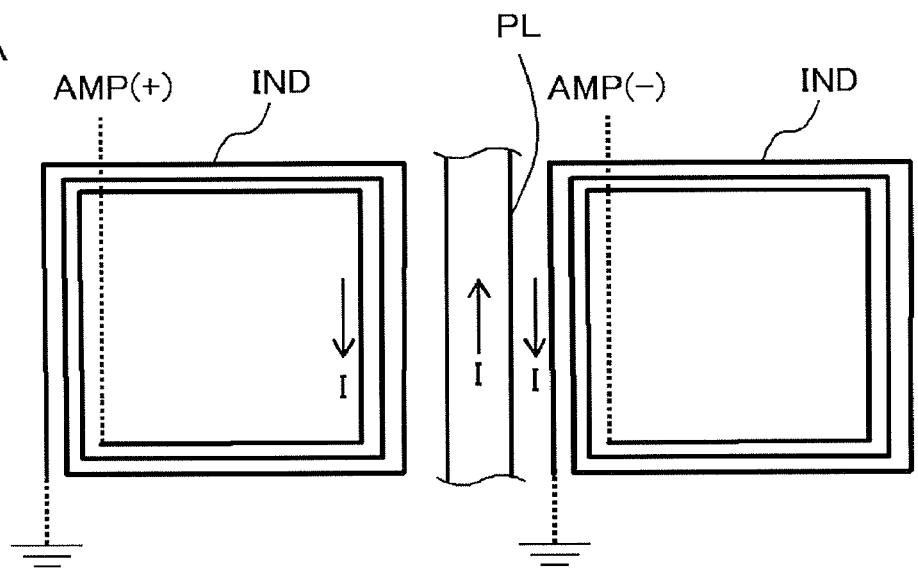

SENSOR DEVICE HAVING INDUCTORS, ANALOG AND LOGIC CIRCUITS FOR DETECTING POWER FLOWING THROUGH A POWERLINE

This application is based on Japanese patent application No. 2013-184208, the content of which is incorporated hereinto by reference.

BACKGROUND

Technical Field

The invention relates to a sensor device, and is a technique applicable to, for example, a sensor device having an inductor.

Related Art

Inductors are used as power meters that detect the amount of power flowing through a power line. When the amount of current flowing through the power line changes, the intensity of a magnetic field generated from the power line also changes. Power according to a change in the intensity of the magnetic field is generated in the inductor. The power meter monitors power to detect the amount of power flowing through the power line.

In general, a magnetic core is provided in the power meter. The magnetic core has a shape surrounding the vicinity of the power line. On the other hand, Japanese Unexamined Patent Publication No. 2011-185914 discloses a coreless type current sensor using a multilayer printed circuit board. In Japanese Unexamined Patent Publication No. 2011-185914, the multilayer printed circuit board is provided with a coil. The coil is formed using two different interconnect layers in the multilayer printed circuit board and a via hole connecting the interconnect layers. A Hall IC is buried inside the coil. A current to be detected flows through the coil.

SUMMARY

A magnetic core is provided in order to increase the sensitivity of a power line. On the other hand, when the magnetic core is provided, a sensor increases in size, and the costs rise. In a method disclosed in Japanese Unexamined Patent Publication No. 2011-185914, a magnetic core may not be provided. However, since the Hall IC is required to be buried in the multilayer printed circuit board, it is not possible to sufficiently reduce costs. The inventors have studied the structure of a new sensor device capable of reducing costs.

The other subjects and novel features will become apparent from the description and accompanying drawings of this specification.

In one embodiment, there is provided a sensor device including a power line and a semiconductor device. The semiconductor device includes an inductor. The inductor is formed using an interconnect layer. The power line and the semiconductor device overlap each other when viewed from a direction perpendicular to the semiconductor device.

According to the embodiment, it is possible to reduce costs of a sensor device.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6A is a diagram showing a first example of a winding direction of two inductors.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments will be described with reference to the accompanying drawings. In all the drawings, like

First Embodiment

Figure 1:
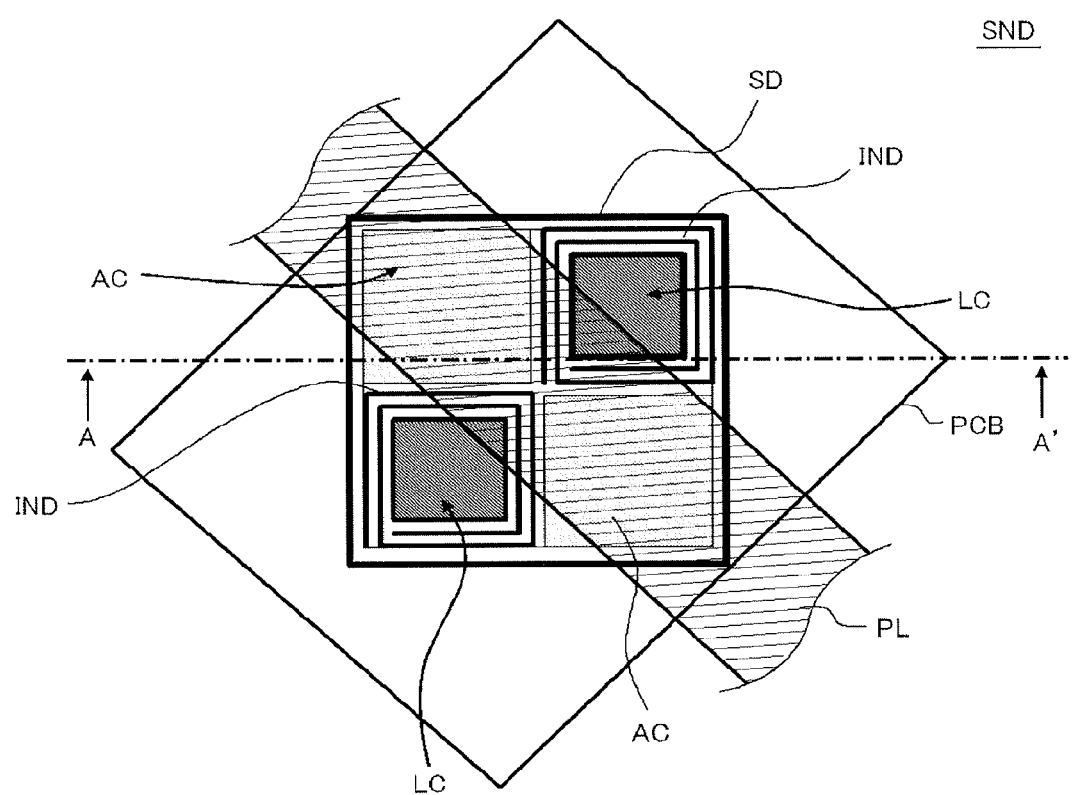
FIG. 1 is a plan view showing a configuration of a sensor device according to a first embodiment.
Figure 2:
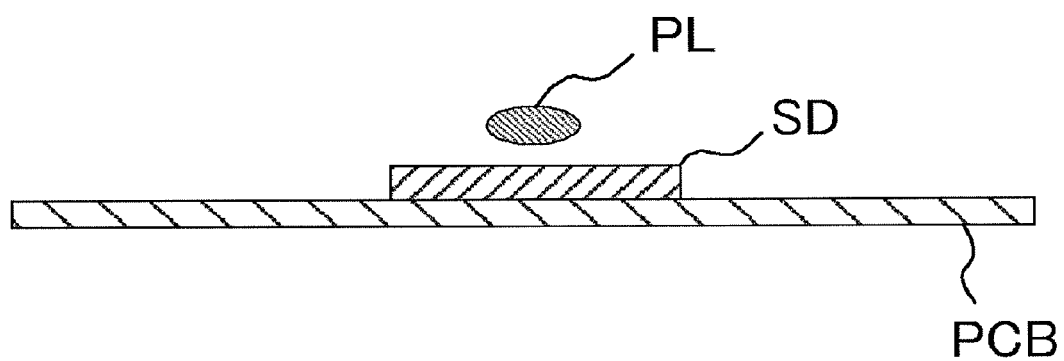
FIG. 2 is a cross-sectional view taken along line A-A' of FIG. 1.

FIG. 1 is a plan view showing a configuration of a sensor device SND according to a first embodiment. FIG. 2 is a cross-sectional view taken along line A-A' of FIG. 1. The sensor device SND according to this embodiment includes a power line PL and a semiconductor device SD. The semiconductor device SD includes an inductor IND. The inductor IND is formed using an interconnect layer (to be described later with reference to FIG. 3). The power line PL and the semiconductor device SD overlap each other when viewed from a direction perpendicular to the semiconductor device SD. Thus, since a distance between the power line PL and the inductor IND can be reduced, it is possible to increase the sensitivity of the sensor device SND without providing a magnetic core. In addition, since it is not necessary to bury an IC or to form a coil pattern in a printed circuit board, manufacturing costs also do not rise. Further, since the inductor IND is provided in the semiconductor device SD, it is possible to reduce a line width of the inductor IND as compared with a case where a coil pattern is formed in a printed circuit board. Accordingly, it is possible to increase a detection value of the inductor IND by increasing the number of windings of the inductor IND without enlarging the sensor device SND. Hereinafter, a description will be given in detail.

As shown in FIG. 1, the semiconductor device SD includes two inductors IND. The two inductors IND have the same number of windings, and are provided so as to be line-symmetrical to each other with respect to the power line PL. The power line PL extends between the two inductors IND when viewed from a direction perpendicular to the semiconductor device SD. In this case, an electromotive force is generated in each of the two inductors IND due to a magnetic field generated in the vicinity of the power line PL. Then, the two electromotive forces are added together, and thus it is possible to increase the intensity of a signal indicating the amount of current flowing through the power line PL. In addition, the two inductors IND are provided, and thus it is possible to suppress a decrease in the intensity of a detection signal even when the position of the semiconductor device SD with respect to the power line PL deviates. For this reason, as will be described later, it is not necessary to provide a magnetic core.

In addition, a logic circuit LC is disposed inside a region surrounded by the inductor IND in the semiconductor device SD, when viewed in a plan view. As will be described later, the logic circuit LC includes a computation unit that processes a signal from the inductor IND which is digitally processed, and calculates the amount of current flowing through the power line PL. In the example shown in this drawing, the logic circuit LC is provided inside each of the two inductors IND. The two logic circuits LC may have the same function, and at least portions thereof may be different from each other.

In addition, the semiconductor device SD includes an analog circuit AC. At least a portion of the analog circuit AC overlaps the power line PL when viewed in a plan view. In this case, as compared with a case where the analog circuit AC is disposed immediately next to the power line PL, the number of components passing through the analog circuit AC in the magnetic field generated in the vicinity of the power line PL is reduced. Thus, it is possible to suppress the influence of the magnetic field on the operation of the analog circuit AC. Meanwhile, the analog circuit AC is, for example, an amplification unit that amplifies a voltage generated in the inductor.

A semiconductor chip included in the semiconductor device SD has a rectangular shape. The two inductors IND are mounted on one diagonal line of the semiconductor chip. In addition, the analog circuit AC is mounted on the other diagonal line of the semiconductor chip. In other words, when the semiconductor chip is quartered by lines connecting the intersection point between the diagonal lines of the semiconductor chip to the midpoints of the sides thereof, the inductor IND is disposed in two regions located on one diagonal line, and the analog circuit AC is disposed in the other two regions.

In the example shown in this drawing, the semiconductor device SD is configured such that the semiconductor chip is mounted on a chip mounting portion such as an interposer or a lead frame and such that the semiconductor chip and the chip mounting portion are sealed with a sealing resin. The semiconductor device SD is mounted on a printed circuit board PCB. As shown in FIG. 2, the power line PL is disposed on the opposite side to the printed circuit board PCB based on the semiconductor device SD. In this case, it is possible to prevent the magnetic field generated in the vicinity of the power line PL from being blocked by the printed circuit board PCB.

Figure 3:
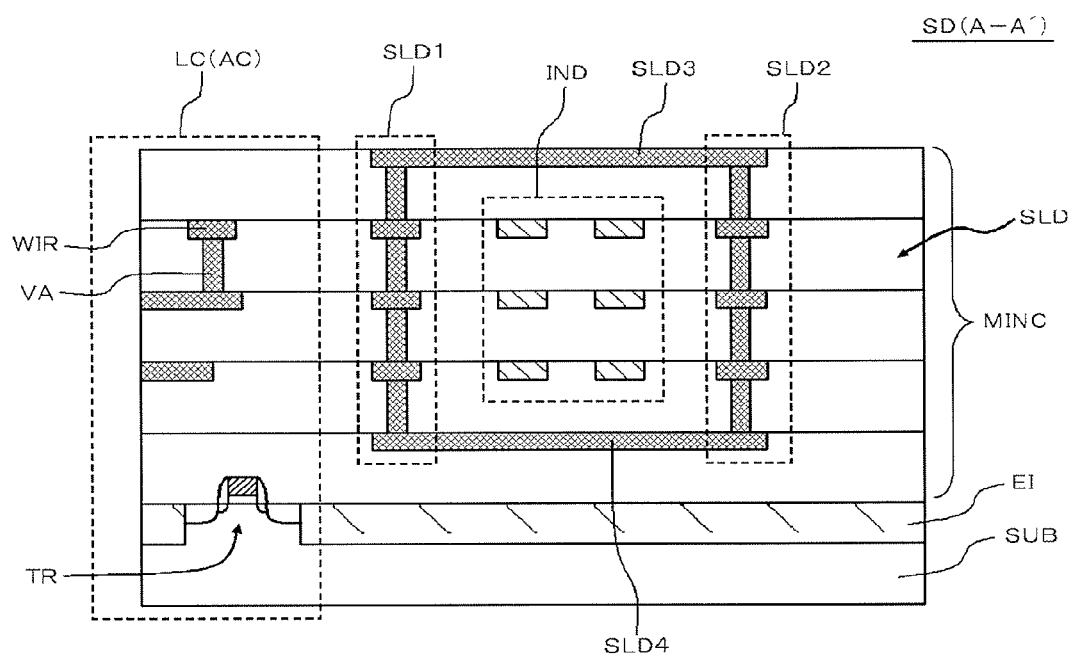
FIG. 3 is a cross-sectional view showing a configuration of a semiconductor chip included in a semiconductor device.

FIG. 3 is a cross-sectional view showing a configuration of the semiconductor chip included in the semiconductor device SD. The semiconductor chip is formed using a substrate SUB. The substrate SUB is, for example, a silicon substrate. A transistor TR and an element isolation region EI are formed in the substrate SUB. The element isolation region EI separates an element formation region from the other regions. For example, the transistor TR is formed in the element formation region. For example, the transistor TR is a portion of the logic circuit LC. However, a portion of the analog circuit AC may be formed in the element formation region.

A multilayer interconnect layer MINC is formed on the transistor TR and the element isolation region EI. The multilayer interconnect layer MINC includes an internal interconnect WIR. The internal interconnect WIR is an interconnect constituting the analog circuit AC or the logic circuit LC, or is a power supply interconnect.

The multilayer interconnect layer MINC includes a plurality of interconnect layers. Each interconnect layer includes a layer in which the internal interconnect WIR is formed, and a layer in which a via hole VA (or a contact) is formed. In the example shown in this drawing, the internal interconnect WIR is buried in an insulating film for forming the interconnect layer. However, at least one internal interconnect WIR may be formed on the insulating film for forming the interconnect layer. In addition, the internal interconnect WIR and the via hole VA may be formed separately from each other or may be formed integrally with each other. The internal interconnect WIR is, for example, Cu or Al. The via hole VA is, for example, Cu, Al, or W.

The inductor IND is formed in the same layer as at least one internal interconnect WIR. In the example shown in this diagram, the inductor IND is formed using a multi-layered interconnect layer (specifically, any of interconnect layers between a second or higher-level interconnect layer and an interconnect layer which is one level lower than the uppermost layer). In this case, the number of windings of the inductor IND is increased, and thus the detection sensitivity of a change in the magnetic field due to the inductor IND becomes higher.

The multilayer interconnect layer MINC is provided with a shield member SLD. Since the shield member SLD surrounds the inductor IND, it is possible to prevent noise being generated in a signal to be detected by the inductor IND due to electrostatic coupling caused by an electric field from the power line PL in the inductor IND. In addition, it is also possible to prevent the logic circuit LC and the analog circuit AC from serving as a noise source of the inductor IND.

In detail, the shield member SLD includes a first shield member SLD1, a second shield member SLD2, a third shield member SLD3, and a fourth shield member SLD4.

The first shield member SLD1 is located between the inductor IND and the logic circuit LC, and the second shield member SLD2 is located on the opposite side to the first shield member SLD1 with the inductor IND interposed therebetween. Both the first shield member SLD1 and the second shield member SLD2 are continuously formed from the interconnect layer below the interconnect layer having the inductor IND formed therein to the interconnect layer above the interconnect layer having the inductor IND formed therein. Each of the first shield members SLD1 and the second shield members SLD2 includes a metal layer located at the same layer as the layer having the internal interconnect WIR formed therein and a metal layer located at the same layer as the layer having the via hole VA formed therein, in any of the interconnect layers.

The third shield member SLD3 is formed in the interconnect layer which is one level higher than the interconnect layer in which the inductor IND is formed. In addition, the fourth shield member SLD4 is formed in the interconnect layer which is one level lower than the interconnect layer in which the inductor IND is formed. The third shield member SLD3 is configured to connect the metal layer of the first shield member SLD1 which is located at the uppermost layer to the metal layer of the second shield member SLD2 which is located at the uppermost layer, and covers an upper portion of the inductor IND. The fourth shield member SLD4 is configured to connect the metal layer of the first shield member SLD1 which is located at the lowermost layer to the metal layer of the second shield member SLD2 which is located at the lowermost layer, and covers a lower portion of the inductor IND. The inductor IND is surrounded by the first shield member SLD1, the third shield member SLD3, the second shield member SLD2, and the fourth shield member SLD4.

Figure 4:
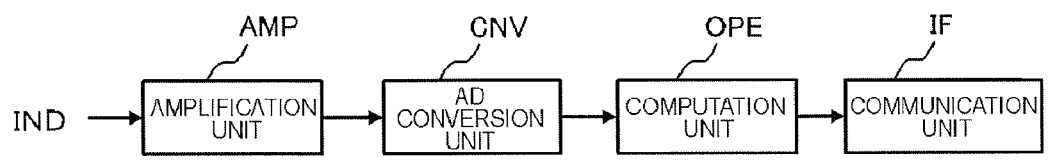
FIG. 4 is a diagram showing an example of a configuration of a circuit.

FIG. 4 is a diagram showing an example of a circuit constituting a sensor device. As described above, the circuit constituting the sensor device includes analog circuits (an amplification unit AMP and an AD conversion unit CNV) and logic circuits (a computation unit OPE and a communication unit IF). The amplification unit AMP amplifies a voltage (=signal) generated in the inductor IND. The AD conversion unit CNV converts the signal amplified by the amplification unit AMP into a digital signal. The computation unit OPE calculates the amount of current flowing through the power line PL using the digital signal. The communication unit IF transmits the amount of current to the outside.

Figure 5:
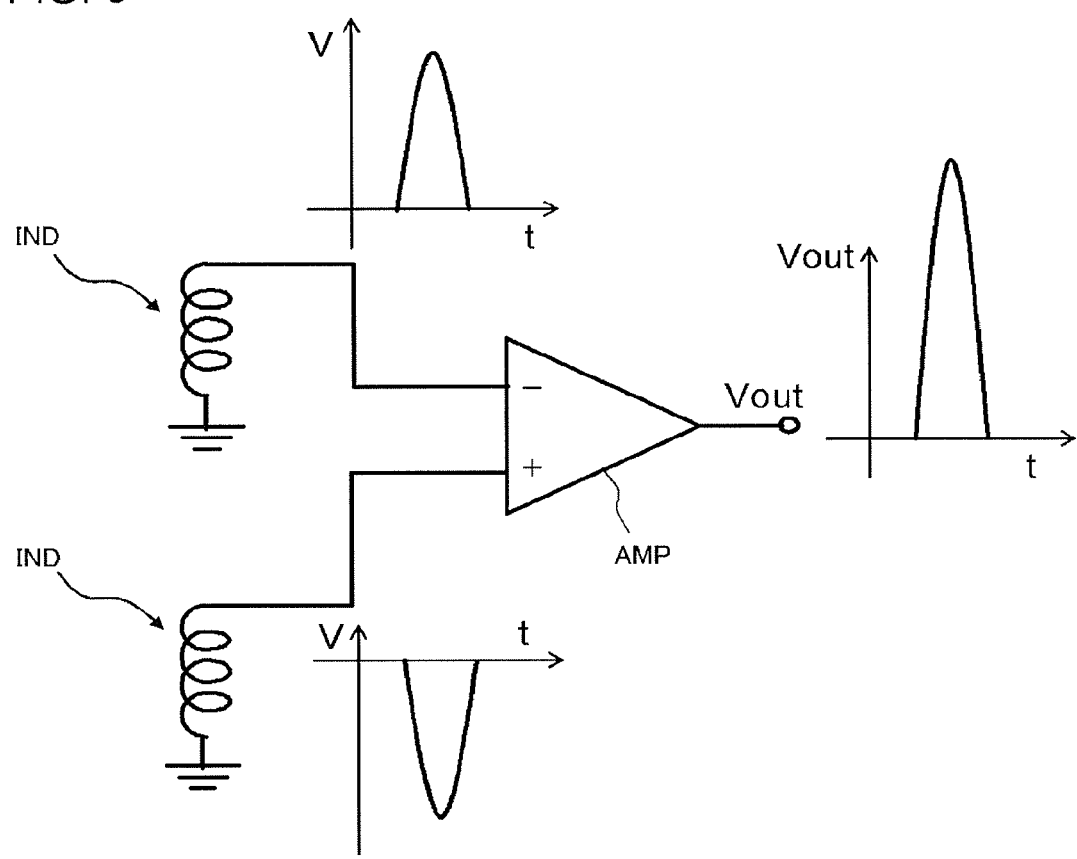
FIG. 5 is a diagram showing a connection relationship between an amplification unit and an inductor.

FIG. 5 is a diagram showing an example of a connection relationship between the amplification unit AMP and the inductor IND. In the example shown in this drawing, the amplification unit AMP is, for example, a differential amplifier circuit. When a current flows through the power line PL, a signal having a positive voltage is generated in one inductor IND, and a signal having a negative voltage is generated in the other inductor IND. An output of the amplification unit AMP is increased by the two signals being input to the amplification unit AMP, as compared with a case where only one inductor IND is connected to the amplification unit AMP.

FIG. 6A is a diagram showing a first example of a winding direction of two inductors IND. In the example shown in this diagram, directions of winding the two inductors IND are the same as each other. A central end of a first inductor IND is connected to an input terminal of the amplification unit AMP on the positive side, and a central end of a second inductor IND is connected to an input terminal of the amplification unit AMP on the negative side. In addition, external ends of the two inductors IND are grounded.

Figure 6B:
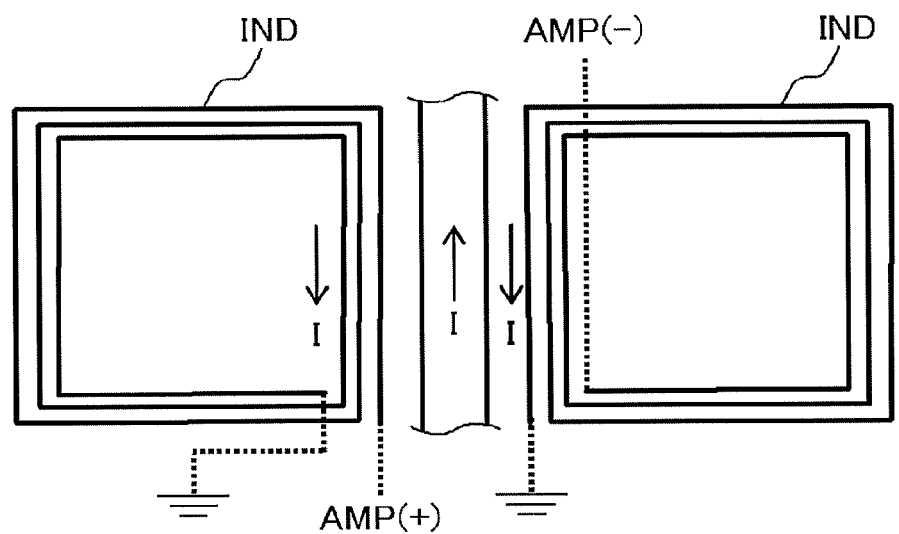
FIG. 6B is a diagram showing a second example of a winding direction of two inductors.

FIG. 6B is a diagram showing a second example of a winding direction of two inductors IND. In the example shown in this diagram, directions of winding the two inductors IND are contrary to each other. A central end of the first inductor IND is connected to one input terminal (for example, an input terminal on the negative side), and an external end of the second inductor IND is connected to the other input terminal (for example, an input terminal on the positive side) of the amplification unit AMP. In addition, an external end of the first inductor IND is grounded, and a central end of the second inductor IND is also grounded.

As described above, according to this embodiment, the power line PL and the semiconductor device SD overlap each other when viewed from a direction perpendicular to the semiconductor device SD. Thus, since a distance between the power line PL and the inductor IND within the semiconductor device SD can be reduced, it is possible to increase the sensitivity of the sensor device SND without providing a magnetic core. In addition, since it is not necessary to bury an IC or to form a coil pattern in a printed circuit board, manufacturing costs also do not rise.

Second Embodiment

Figure 7:
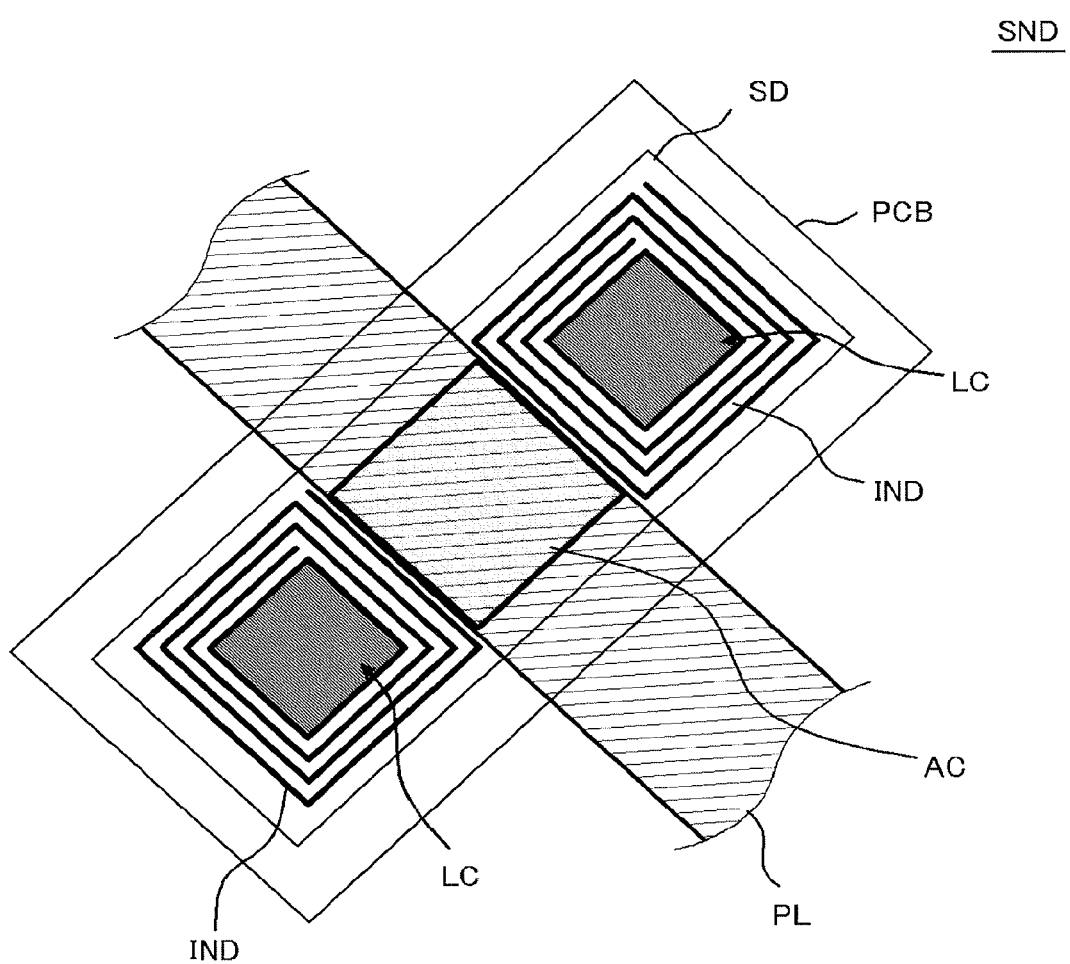
FIG. 7 is a plan view showing a configuration of a sensor device according to a second embodiment.

FIG. 7 is a plan view showing a configuration of a sensor device SND according to a second embodiment. The sensor device SND shown in this diagram has the same configuration as that of the sensor device SND according to the first embodiment, except in the following respects.

First, two logic circuits LC are disposed close to two short sides of the semiconductor device SD, respectively. An analog circuit AC is disposed between the two logic circuits LC. Such a layout is suitable for a case where a semiconductor chip included in the semiconductor device SD has an elongated planar shape.

Also in this embodiment, the same effects as in the first embodiment are obtained. In addition, when viewed from a direction perpendicular to the semiconductor device SD, all of two inductors IND can be configured not to overlap a power line PL, and thus the amount of magnetic field passing through the inductors IND, in the magnetic field generated in the vicinity of the power line PL, is increased. Accordingly, it is possible to further increase the sensitivity of the sensor device SND.

Third Embodiment

Figure 8:
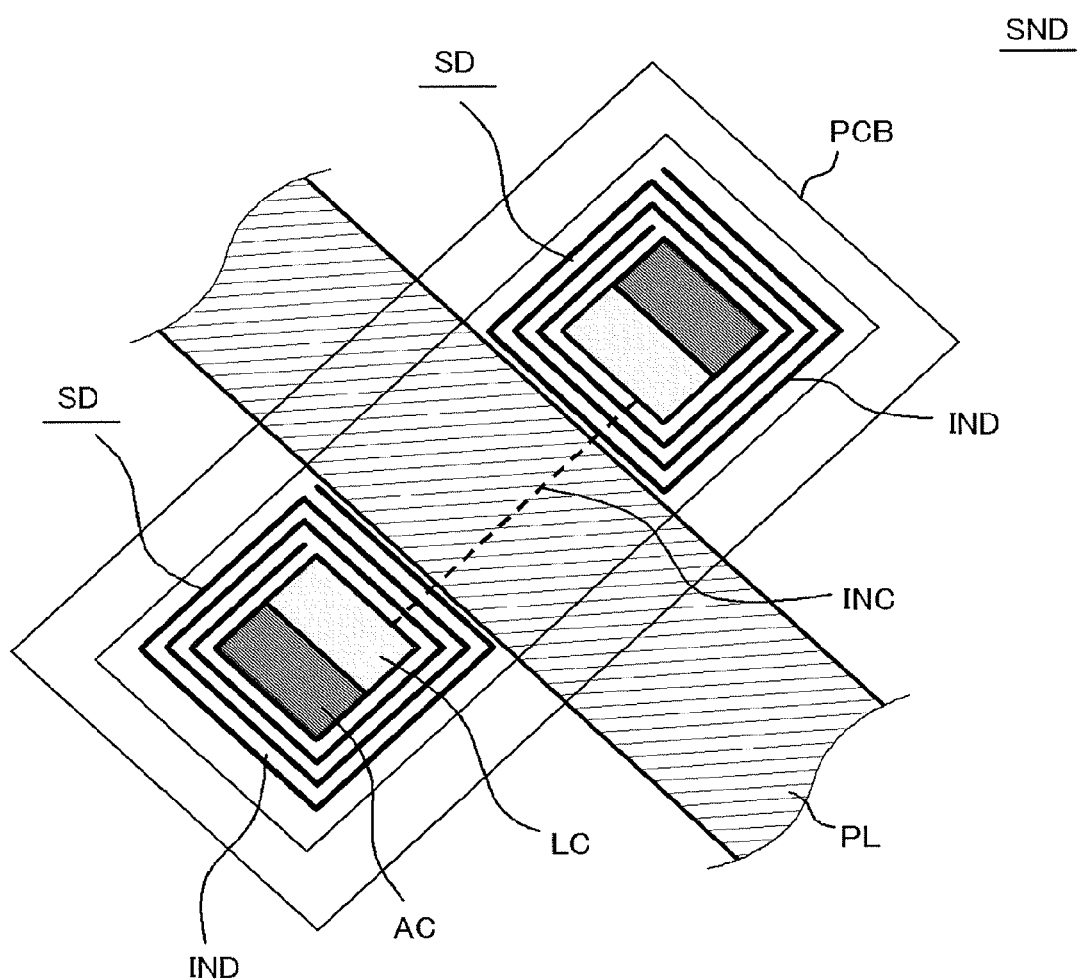
FIG. 8 is a plan view showing a configuration of a sensor device according to a third embodiment.

FIG. 8 is a plan view showing a configuration of a sensor device SND according to a third embodiment. The sensor device SND according to this embodiment has the same configuration as that of the sensor device SND according to the second embodiment, except in the following respects.

First, the sensor device SND includes two semiconductor devices SD. Both of the two semiconductor devices SD are mounted on one printed circuit board PCB, and each semiconductor device includes an inductor IND, an analog circuit AC, and a logic circuit LC. The two semiconductor devices SD are connected to each other through at least one interconnect INC provided on a printed circuit board PCB. The interconnect INC may connect the inductors IND included in the two respective semiconductor devices SD to each other as shown in FIG. 5 and FIGS. 6A and 6B, or may connect the circuits included in the two respective semiconductor devices SD to each other. In addition, the power line PL extends between the two semiconductor devices SD when viewed from a direction perpendicular to the printed circuit board PCB.

Also in either of the two semiconductor devices SD, the logic circuit LC is disposed closer to the power line PL than the analog circuit AC. In this case, it is possible to prevent noise from entering the analog circuit AC due to a magnetic field generated in the vicinity of the power line PL.

Figure 9:
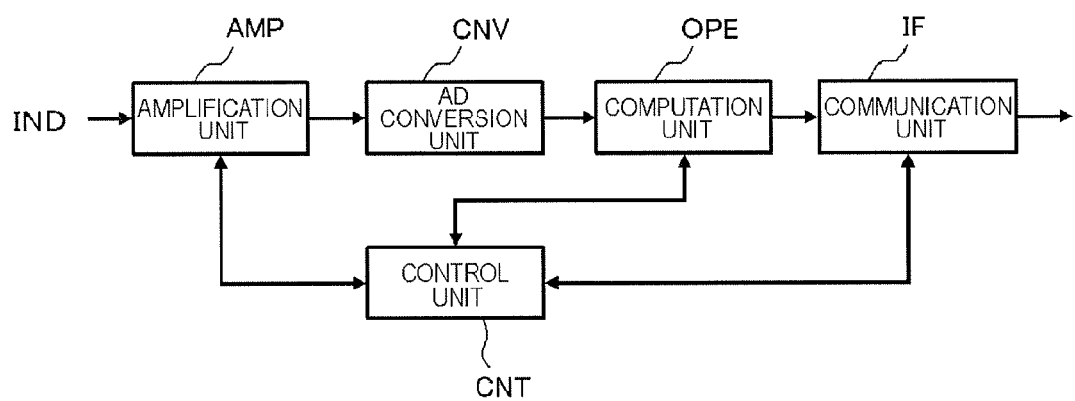
FIG. 9 is a diagram showing a configuration of a circuit according to this embodiment.

FIG. 9 is a diagram showing a circuit constituting the sensor device according to this embodiment. The circuit constituting the sensor device according to this embodiment has the same configuration as the circuit constituting the sensor device shown in FIG. 4, except that the circuit includes a control unit CNT. The following description is given on the assumption that the circuits included in the two semiconductor devices SD are connected to each other by the interconnect INC of the printed circuit board PCB.

The control unit CNT communicates with a control unit CNT of another semiconductor device SD through a communication unit IF. In addition, the control unit CNT controls turn-on and turn-off of the communication unit IF and turn-on and turn-off of a computation unit OPE. Specifically, one of the two semiconductor devices SD serves as a master, and the other serves as a slave.

When a voltage value of the inductor IND in the semiconductor device SD serving as a master is sufficiently large, the control unit CNT of the semiconductor device SD serving as a master transmits information indicating that effect to the control unit CNT of the semiconductor device SD serving as a slave. Then, the control unit CNT of the semiconductor device SD serving as a slave turns off the computation unit OPE of the semiconductor device SD. Thereafter, the control unit CNT of the semiconductor device SD serving as a master turns off a circuit used for communication with the semiconductor device SD which is a slave in the communication unit IF of the semiconductor device SD.

On the other hand, when a voltage value of the inductor IND in the semiconductor device SD serving as a master is small, the control unit CNT of the semiconductor device SD serving as a master turns on a circuit used for communication with the semiconductor device SD which is a slave in the communication unit IF of the semiconductor device SD, and then turns on the computation unit OPE of the semiconductor device SD which is a slave through the control unit CNT of the semiconductor device SD which is a slave. Thus, the semiconductor device SD serving as a master and the semiconductor device SD serving as a slave calculate the amount of current and outputs the calculated amount of current to the outside.

Also in this embodiment, the same effects as in the first embodiment are obtained. In addition, when a magnetic field applied to the inductor IND is sufficiently large, a portion of the communication unit IF of the semiconductor device SD serving as a master and the computation unit OPE of the semiconductor device SD serving as a slave are turned off. Accordingly, the power consumption of the sensor device SND is reduced.

Fourth Embodiment

Figure 10:
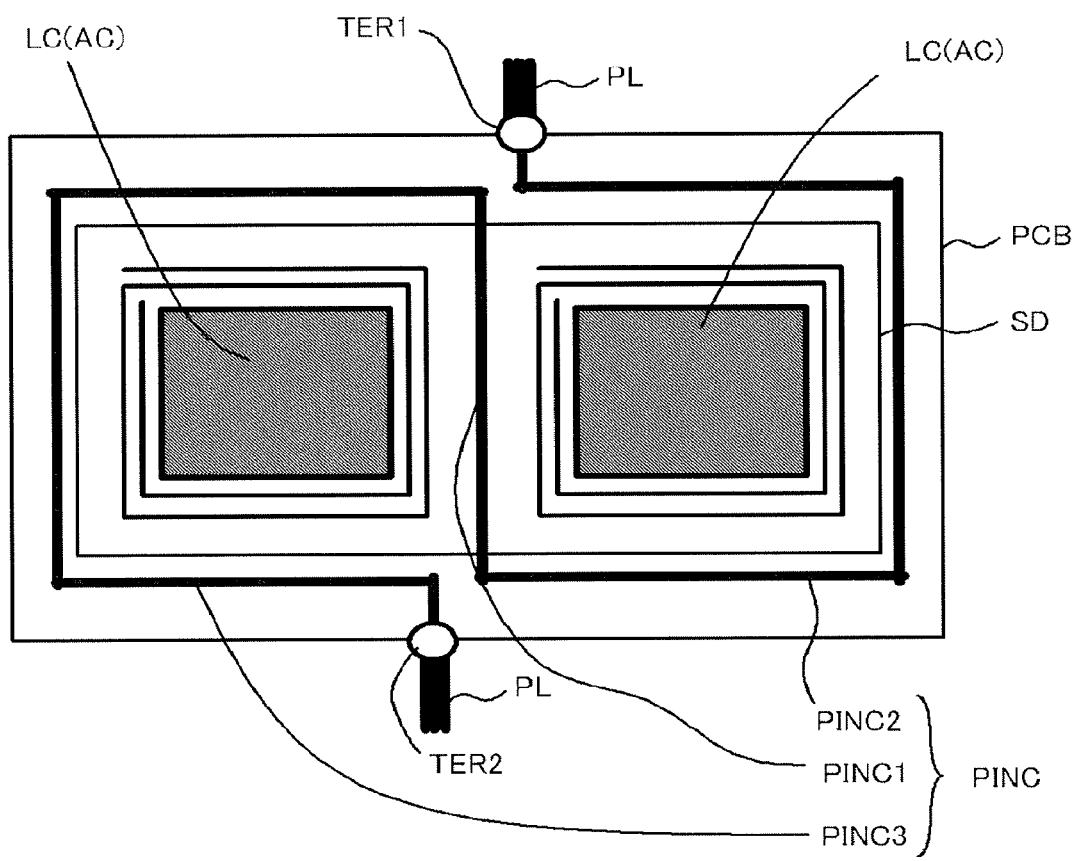
FIG. 10 is a diagram showing a configuration of a sensor device according to a fourth embodiment.

FIG. 10 is a diagram showing a configuration of a sensor device SND according to a fourth embodiment. The sensor device SND according to this embodiment has the same configuration as that of the sensor device SND according to the second embodiment, except in the following respects.

First, an analog circuit AC is not disposed in a portion located between two inductors IND in the semiconductor device SD. Alternatively, the two inductors IND are disposed in proximity to each other.

A printed circuit board PCB includes a first terminal TER1, a second terminal TER2, and a power line PINC. An end of the power line PINC is connected to the first terminal TER1, and the other end of the power line PINC is connected to the second terminal TER2.

In this embodiment, the power line PL is divided into two portions of an upper stream side portion and a downstream side portion. The first terminal TER1 is connected to the upper stream side portion of the power line PL, and the second terminal TER2 is connected to the downstream side portion of the power line PL. In other words, the power line PINC serves as a portion of the power line PL and connects the upper stream side portion and the downstream side portion of the power line PL to each other.

When viewed from a direction perpendicular to the printed circuit board PCB, a portion (in the example shown in this diagram, a first portion PINC1) of the power line PINC extends between the two inductors IND. The other portions (in the example shown in this diagram, a second portion PINC2 and a third portion PINC3) of the power line PINC surround the two inductors IND.

In detail, four sides of the semiconductor device SD are parallel to four sides of the printed circuit board PCB, and the two inductors IND are lined up in a direction in which a long side of the printed circuit board PCB extends. The first terminal TER1 is located at a center portion of one long side of the printed circuit board PCB, and the second terminal TER2 is located at a center portion of the other long side of the printed circuit board PCB. The first terminal TER1 is connected to one end of the first portion PINC1 through the second portion PINC2 of the power line PINC. In addition, the second terminal TER2 is connected to the other end of the first portion PINC1 through the third portion PINC3 of the power line PINC. The second portion PINC2 surrounds one inductor IND together with the first portion PINC1, and the third portion PINC3 surrounds the other inductor IND together with the first portion PINC1.

In the example shown in this diagram, the external shape of the inductor IND is a substantially rectangular shape. The two inductors IND are lined up in a direction in which the respective sides thereof face each other. The first portion PINC1 of the power line PINC is located between the sides facing each other. The second portion PINC2 and the third portion PINC3 of the power line PINC extend along the other three sides of the inductor IND.

Also in this embodiment, the same effects as in the first embodiment are obtained. In addition, since a distance between the power line PL (power line PINC) and the inductor IND can be reduced, the detection sensitivity of a change in the magnetic field due to the inductor IND becomes higher.

In addition, the power line PINC surrounds each of the two inductors IND. Accordingly, the detection sensitivity of a change in the magnetic field generated in the vicinity of the power line PINC due to the inductor IND becomes further higher.

Fifth Embodiment

Figure 11:
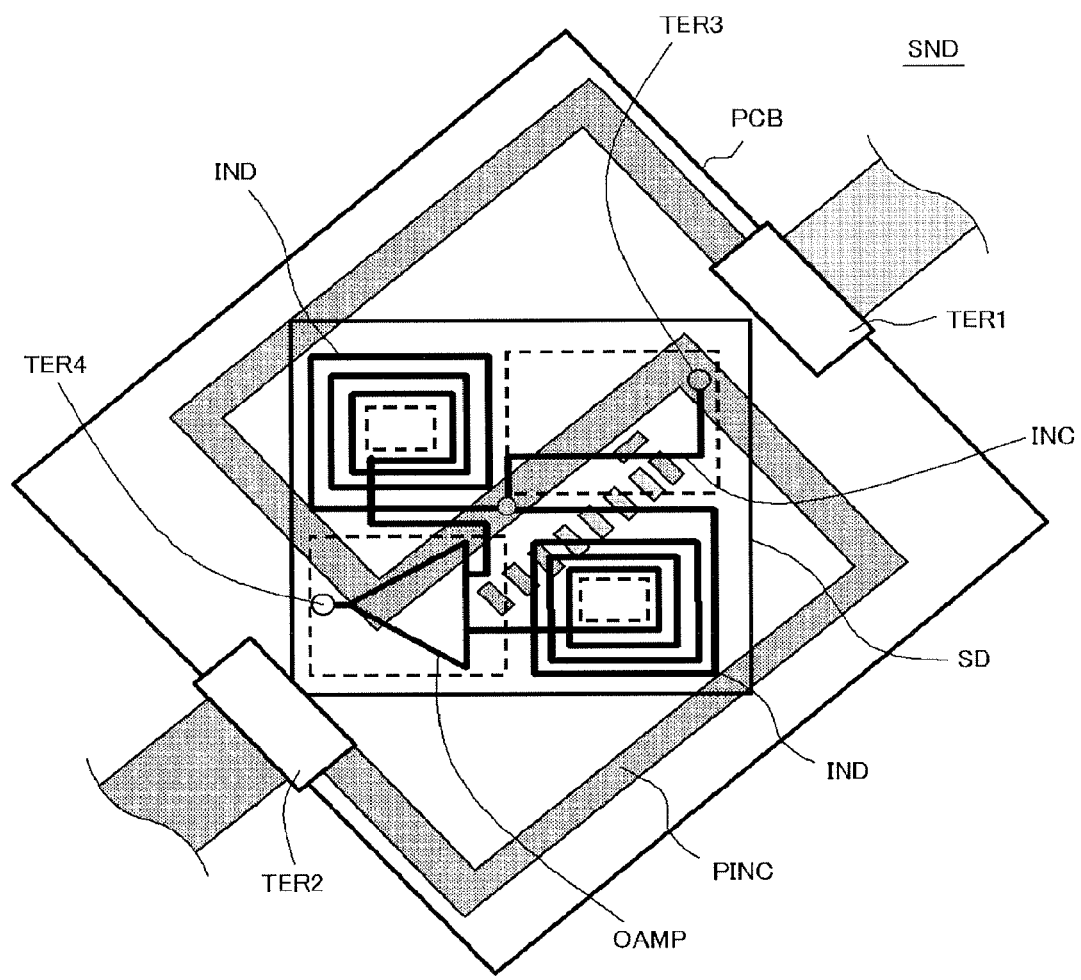
FIG. 11 is a plan view showing a configuration of a sensor device according to a fifth embodiment.

FIG. 11 is a plan view showing a configuration of a sensor device SND according to a fifth embodiment. The sensor device SND according to this embodiment has the same configuration as that of the sensor device SND according to the fourth embodiment, except in the following respects.

First, winding directions of two inductors IND are the same as each other. Ends of the two inductors IND on the outer circumference side are connected to each other.

In addition, a semiconductor device SD includes an operational amplifier OAMP, a third terminal TER3, and a fourth terminal TER4. The respective ends of the two inductors IND on the center side are connected to two input terminals of the operational amplifier OAMP. The third terminal TER3 is connected to the ends of the two inductors IND on the outer circumference side, and the fourth terminal TER4 is connected to an output terminal of the operational amplifier OAMP. A fixed potential is applied to the third terminal TER3.

In addition, when viewed from a direction perpendicular to a printed circuit board PCB, four sides of the semiconductor device SD are inclined to four sides of the printed circuit board PCB.

Also in this embodiment, the same effects as in the third embodiment are obtained.

Sixth Embodiment

Figure 12:
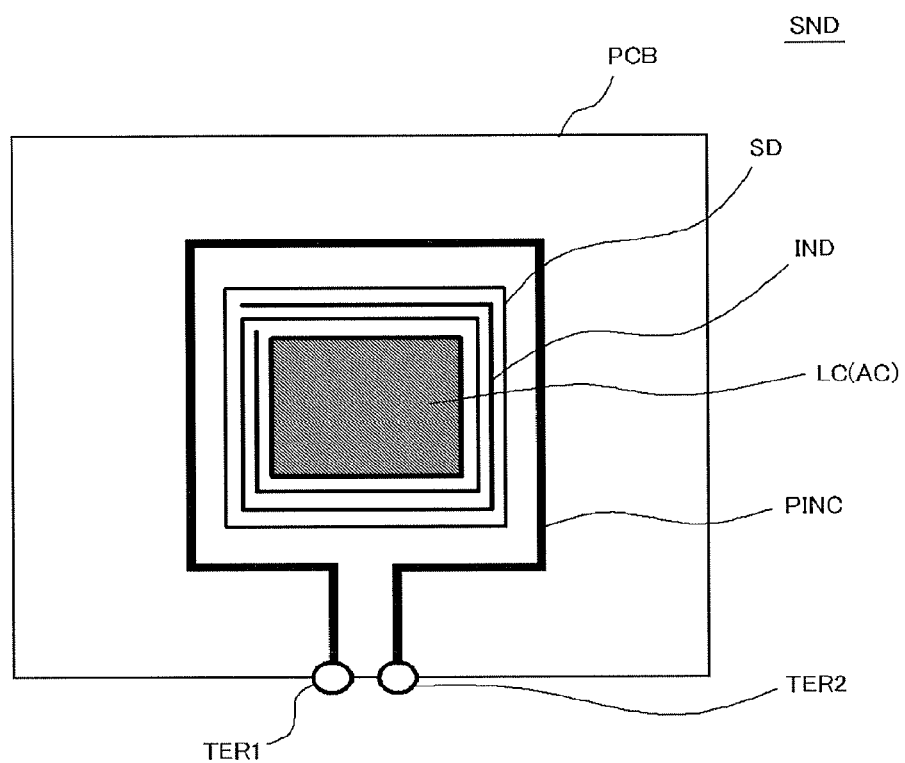
FIG. 12 is a plan view showing a configuration of a sensor device according to a sixth embodiment.

FIG. 12 is a plan view showing a configuration of a sensor device SND according to a sixth embodiment. The sensor device SND according to this embodiment has the same configuration as that of the sensor device SND according to the fourth embodiment, except in the following respects.

First, a semiconductor device SD includes only one inductor IND. The inductor IND is formed along an edge of a semiconductor chip included in the semiconductor device SD. An analog circuit AC (also a logic circuit LC when necessary) is provided inside the inductor IND.

In addition, a first terminal TER1 and a second terminal TER2 are provided at the same side of a printed circuit board PCB. A power line PINC is provided so as to surround the semiconductor device SD.

Also in this embodiment, the same effects as in the fourth embodiment are obtained. In addition, since the number of inductors IND can be set to one, the degree of freedom of designing the semiconductor device SD is improved.

Seventh Embodiment

Figure 13:
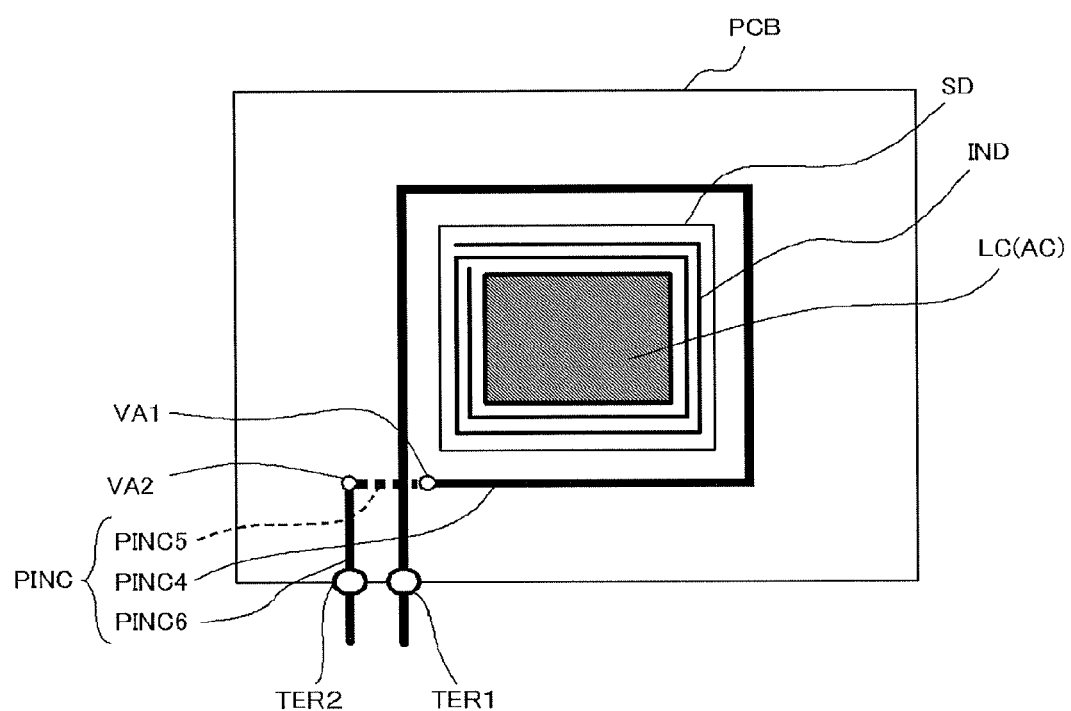
FIG. 13 is a diagram showing a configuration of a sensor device according to a seventh embodiment.

FIG. 13 is a diagram showing a configuration of a sensor device SND according to a seventh embodiment. The sensor device SND according to this embodiment has the same configuration as that of the sensor device SND according to the sixth embodiment, except for a layout of a power line PINC.

In this embodiment, a portion of the power line PINC is located on a surface (second surface) on the opposite side to a surface (first surface) on which a semiconductor device SD is mounted in a printed circuit board PCB. A portion of the power line PINC located on the second surface crosses a portion of the power line PINC located on the first surface when viewed in a plan view. In this manner, the power line PINC can surround the semiconductor device SD without a gap.

Specifically, the power line PINC includes a fourth portion PINC4, a fifth portion PINC5, and a sixth portion PINC6. The fourth portion PINC4 is located on the first surface of the printed circuit board PCB, and one end thereof is connected to a first terminal TER1. The fourth portion PINC4 surrounds four sides of the semiconductor device SD. The fifth portion PINC5 is located on the second surface of the printed circuit board PCB, and the fifth portion PINC5 crosses the fourth portion PINC4 when viewed in a plan view. One end of the fifth portion PINC5 is connected to the other end of the fourth portion PINC4 through a via hole VA1. In addition, the other end of the fifth portion PINC5 is connected to one end of the sixth portion PINC6 through the via hole VA1. The other end of the sixth portion PINC6 is connected to a second terminal TER2.

Also in this embodiment, the same effects as in the sixth embodiment are obtained. In addition, since the power line PINC surrounds the semiconductor device SD without a gap, the detection sensitivity of a change in the magnetic field generated in the vicinity of the power line PINC due to an inductor IND becomes higher.

Eighth Embodiment

Figure 14:
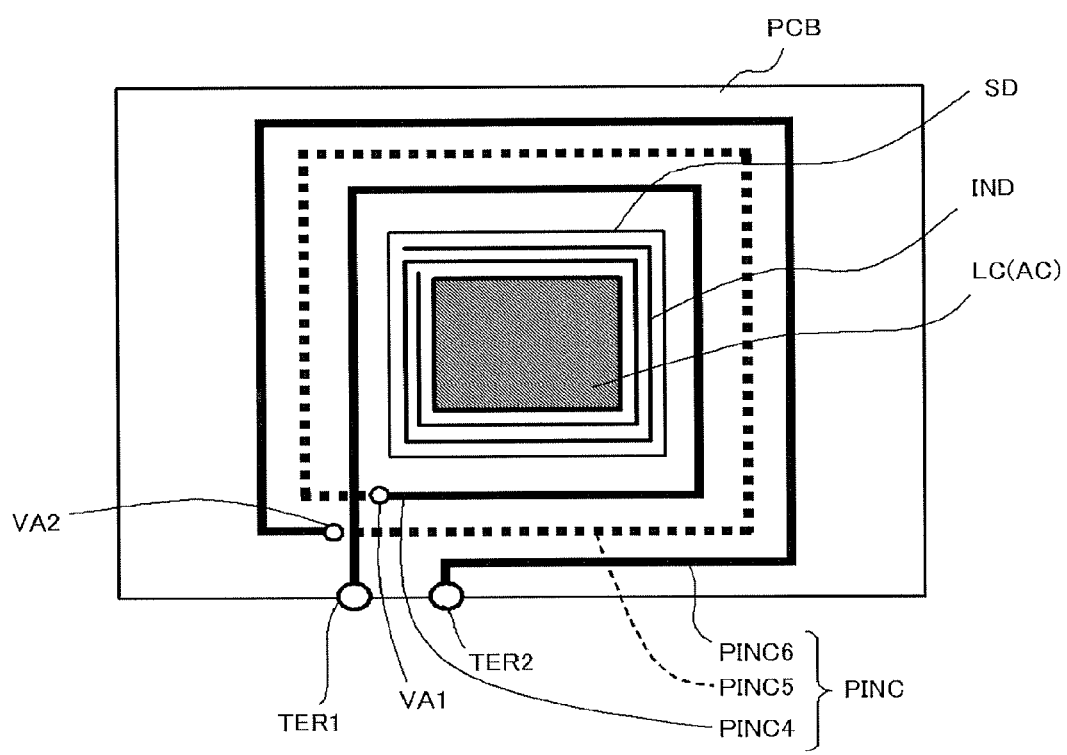
FIG. 14 is a plan view showing a configuration of a sensor device according to an eighth embodiment.

FIG. 14 is a plan view showing a configuration of a sensor device SND according to an eighth embodiment. The sensor device SND according to this embodiment has the same configuration as the sensor device SND according to the seventh embodiment, except that each of a fifth portion PINC5 and a sixth portion PINC6 of a power line PINC surrounds a semiconductor device SD.

Also in this embodiment, the same effects as in the seventh embodiment are obtained. In addition, since a power line PINC multiply surrounds the semiconductor device SD, the detection sensitivity of a change in the magnetic field generated in the vicinity of the power line PINC due to an inductor IND becomes higher.

Ninth Embodiment

Figure 15:
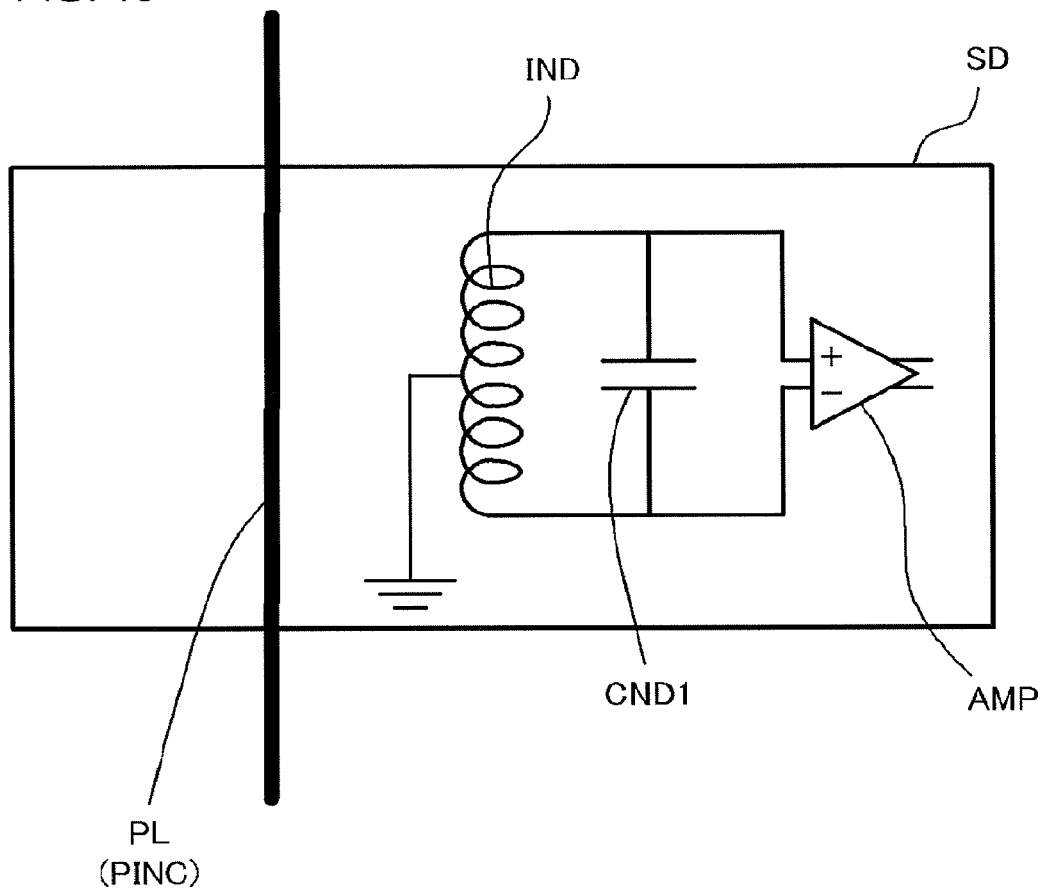
FIG. 15 is a diagram showing main components of an equivalent circuit of a semiconductor device according to a ninth embodiment.

FIG. 15 is a diagram showing main components of an equivalent circuit of a semiconductor device SD according to a ninth embodiment. A sensor device SND according to this embodiment has the same configuration as that of the sensor device SND according to any one of the first to eighth embodiments, except that the semiconductor device SD includes a capacitor CND1 as a protection element.

The capacitor CND1 is provided in parallel to an inductor IND. That is, one end of the capacitor CND1 is connected to a first terminal of an amplification unit AMP, and the other end of the capacitor CND1 is connected to a second terminal of the amplification unit AMP.

Figure 16:
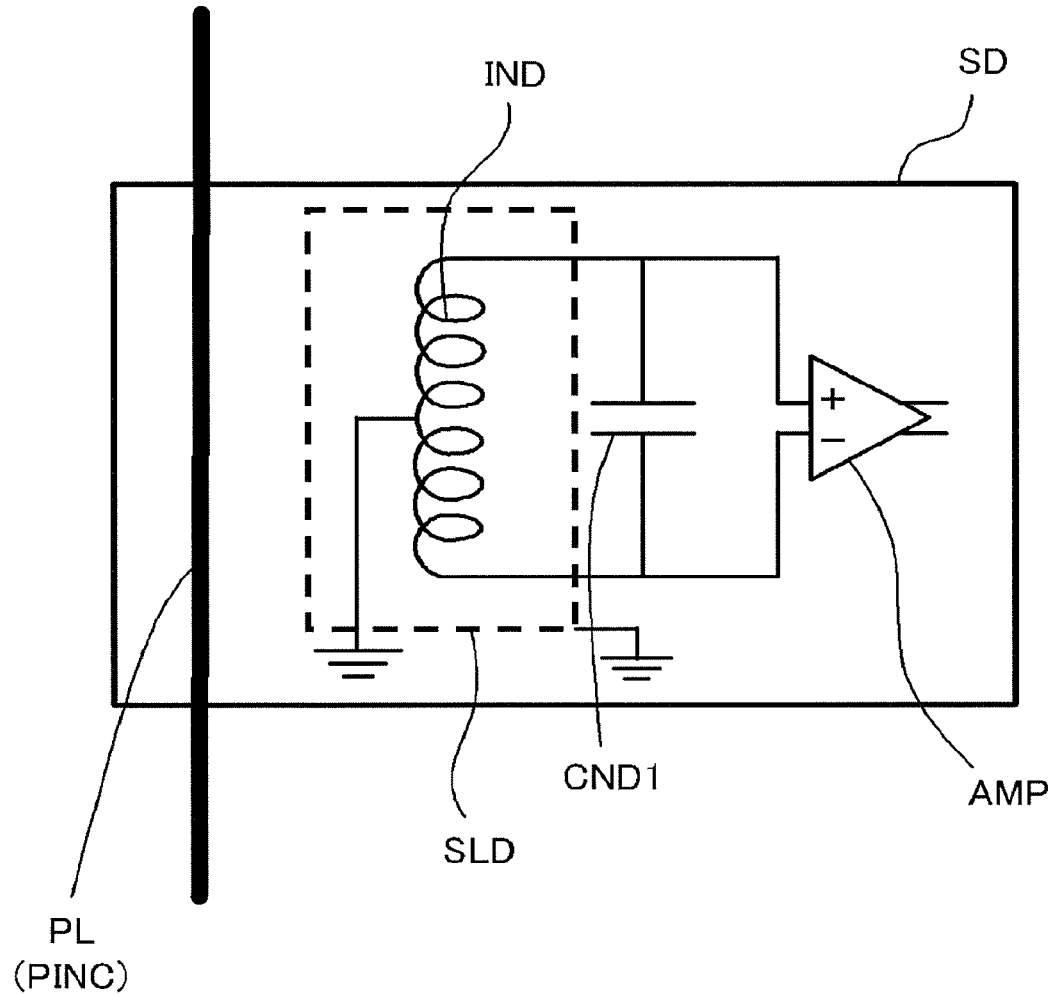
FIG. 16 is a diagram showing a modification example of FIG. 15.

FIG. 16 is a diagram showing a modification example of FIG. 15. This modification example is the same as FIG. 15, except that an inductor IND is surrounded by a shield member SLD.

Figure 17:
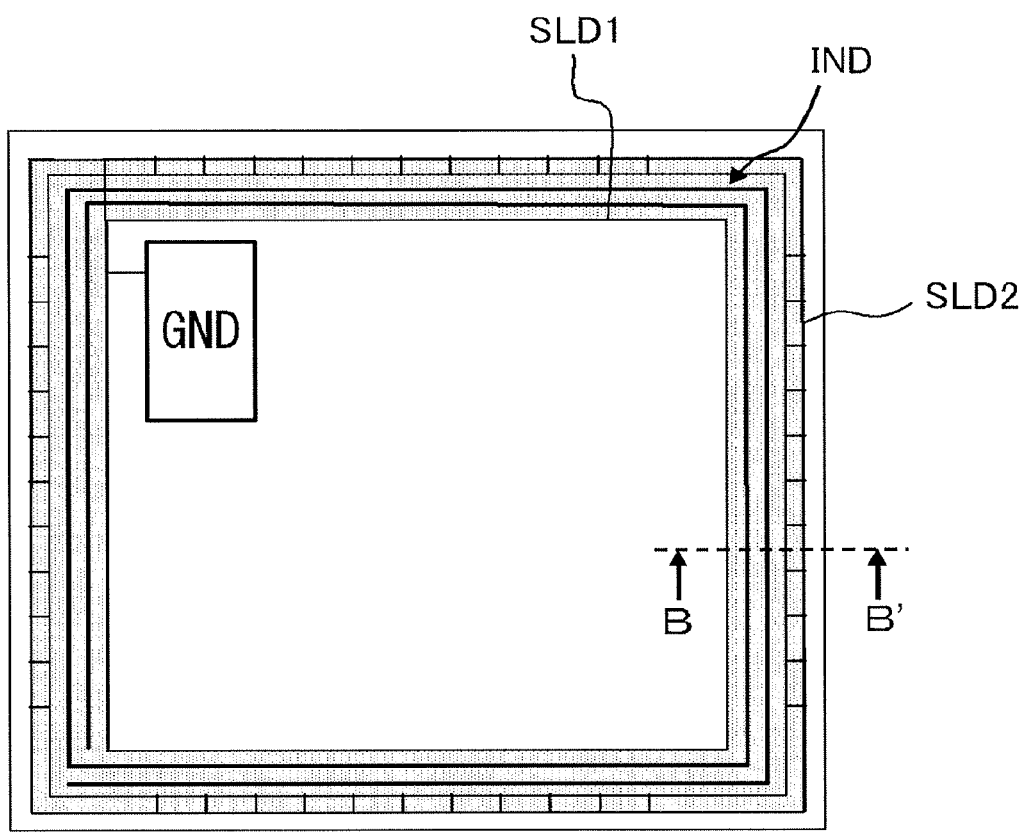
FIG. 17 is a plan view of a semiconductor chip included in a semiconductor device shown in FIG. 16.

FIG. 17 is a plan view of a semiconductor chip included in a semiconductor device SD according to this modification example. In the example shown in this diagram, an inductor IND is formed along an edge of the semiconductor chip. The first shield member SLD1 shown in FIG. 3 is formed further on the inner-circumferential side than the inductor IND, and the second shield member SLD2 shown in FIG. 3 is formed further on the outer-circumferential side than the inductor IND. The second shield member SLD2 also serves as a guard ring.

Figure 18:
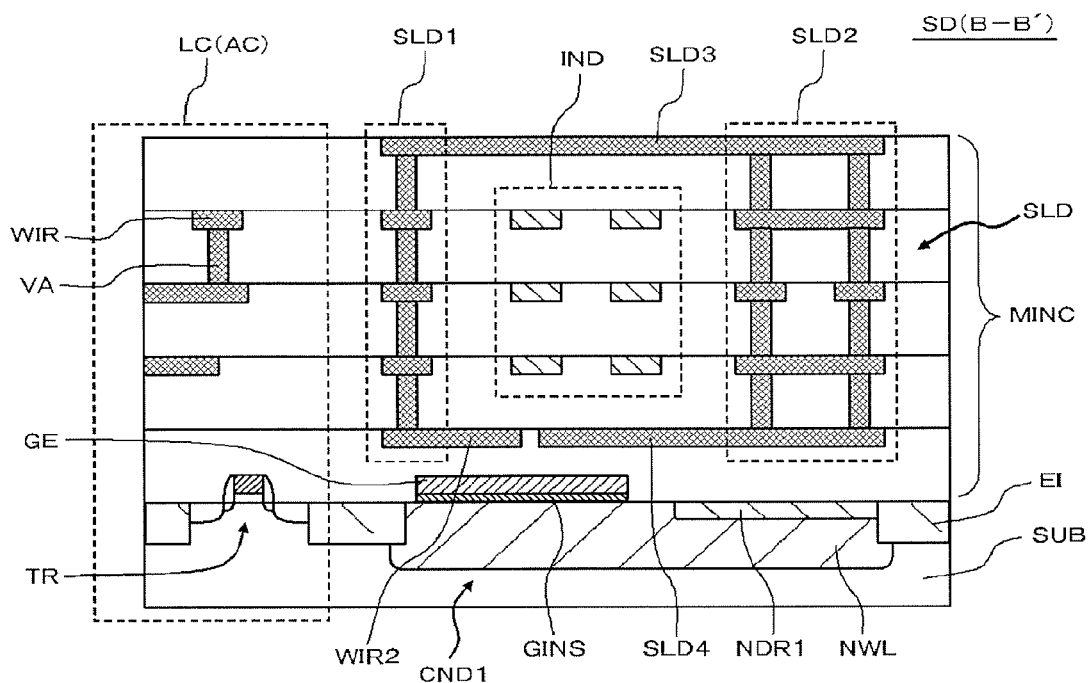
FIG. 18 is a diagram showing a first example of a cross-section B-B' of FIG. 17.

FIG. 18 is a diagram showing a first example of a cross-section B-B' of FIG. 17. In this diagram, the same components as those in FIG. 3 are denoted by the same reference numerals.

In the example shown in this diagram, the lowermost layer of the first shield member SLD1 is formed of a layer which is one level lower than the lowermost layer of the inductor IND. In a region overlapping the first shield member SLD1 when viewed in a plan view, an internal interconnect WIR2 is formed in the same layer as the fourth shield member SLD4. In addition, the second shield member SLD2 is multiply configured.

In a substrate SUB, a capacitor CND1 is formed in a region overlapping a shield member SLD when viewed in a plan view. The capacitor CND1 includes a well NWL, a diffusion region NDR1, an insulating film GINS, and an electrode GE. All of the wells NWL and the diffusion regions NDR1 are first conductivity type (for example, $n^+$-type) regions formed in the substrate SUB. The impurity concentration of the diffusion region NDR1 is higher than the impurity concentration of the well NWL. The electrode GE constitutes one electrode of the capacitor CND1, and the diffusion region NDR1 constitutes the other electrode of the capacitor CND1. Meanwhile, the insulating film GINS is formed in the same process as a gate insulating film of a transistor TR, and the electrode GE is formed in the same process as a gate electrode of the transistor TR.

The internal interconnect WIR2 is connected to the electrode GE through a contact, and the fourth shield member SLD4 of the shield member SLD is connected to a second conductivity type (for example, $p^-$-type) diffusion region (not shown) through a contact.

Figure 19:
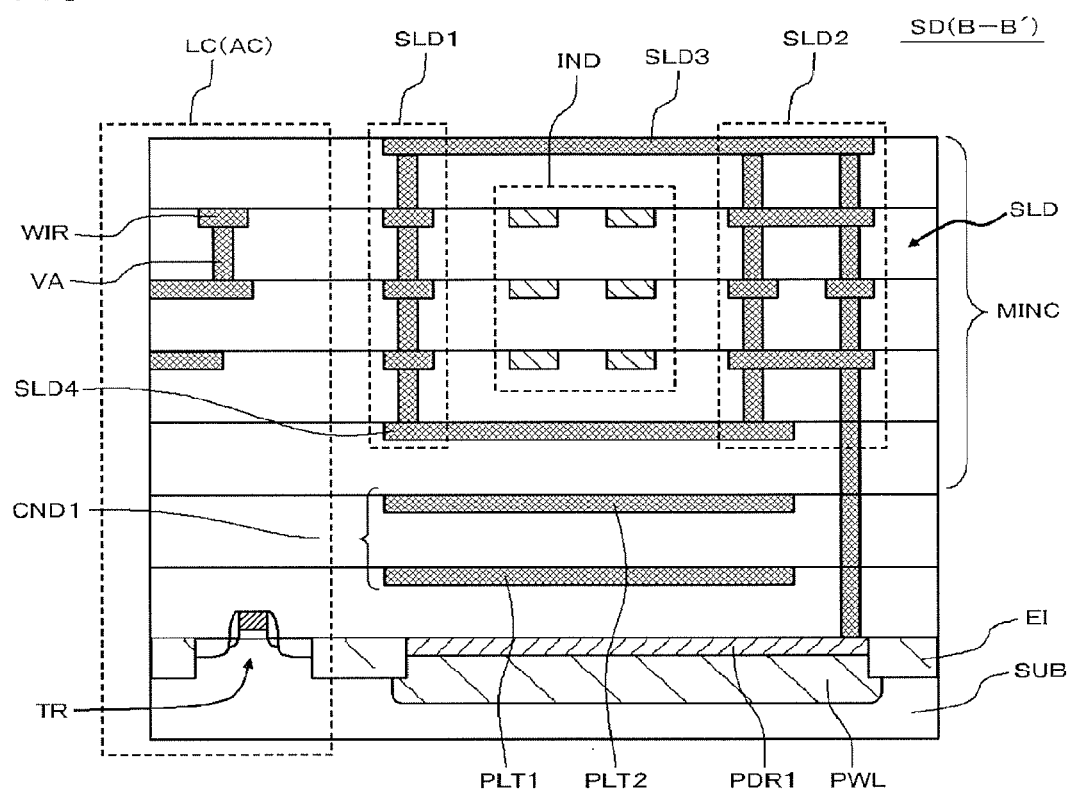
FIG. 19 is a diagram showing a second example of the cross-section B-B' of FIG. 17.

FIG. 19 is a diagram showing a second example of the cross-section B-B' of FIG. 17. In the example shown in this diagram, the fourth shield member SLD4 is formed in the third interconnect layer from the bottom of a multilayer interconnect layer MINC. A conductive pattern PLT1 is formed in a portion overlapping the fourth shield member SLD4 in the lowermost interconnect layer of the multilayer interconnect layer MINC, and a conductive pattern PLT2 is formed in the interconnect layer thereon.

In addition, a diffusion region PDR1 and a well PWL are formed in a region overlapping the shield member SLD in the substrate SUB when viewed in a plan view. Both of the well PWL and the diffusion region PDR1 are second conductivity type (for example, P-type) regions formed in the substrate SUB. The diffusion region PDR1 is connected to the shield member SLD through a contact. The diffusion region PDR1 is formed in the surface layer of the well PWL.

The conductive patterns PLT1 and PLT2 overlap both of the fourth shield member SLD4 and the diffusion region PDR1. The conductive pattern PLT1 is one electrode of the capacitor CND1, and the conductive pattern PLT2 is the other electrode of the capacitor CND1. The conductive pattern PLT1 is connected to an end of the inductor IND through the internal interconnect WIR2 (not shown), and the conductive pattern PLT2 is connected to the other end of the inductor IND.

Also in this embodiment, the same effects as any one of the first to eighth embodiments are obtained. In addition, the capacitor CND1 is connected in parallel to the inductor IND. For this reason, also in a case where an unexpectedly large amount of current such as lightning flows through a power line PL and a large amount of voltage is generated in the inductor IND, a portion of a current caused by the voltage is absorbed by the capacitor CND1, and thus it is possible to prevent the amplification unit AMP from being destroyed. Further, when an immeasurable high-frequency current is generated in the inductor IND, the high-frequency current can be cut off.

Tenth Embodiment

Figure 20:
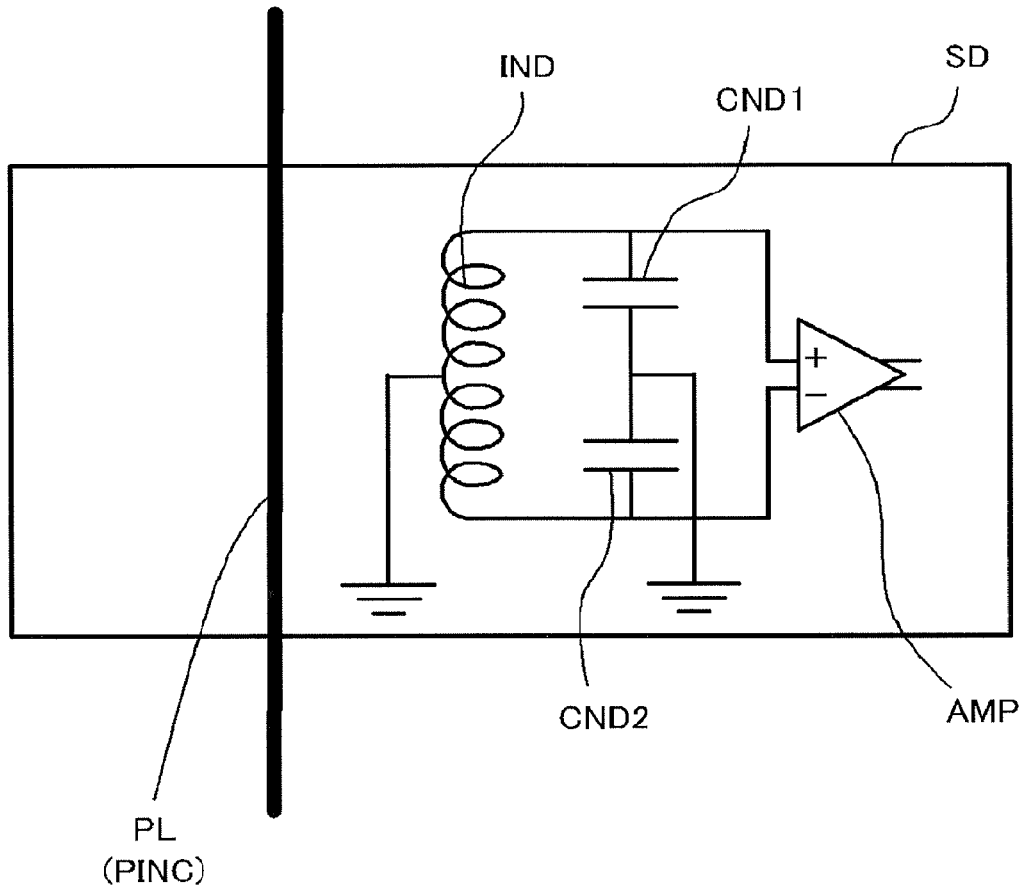
FIG. 20 is a diagram showing main components of an equivalent circuit of a semiconductor device according to a tenth embodiment.

FIG. 20 is a diagram showing main components of an equivalent circuit of a semiconductor device SD according to a tenth embodiment. A sensor device SND according to this embodiment has the same configuration as that of the sensor device SND according to the ninth embodiment, except that a protection element of the semiconductor device SD is constituted by capacitors CND1 and CND2.

The capacitors CND1 and CND2 are connected to each other in series, and are parallel to an inductor IND. The capacitor CND1 and the capacitor CND2 are grounded therebetween. For example, the capacitors CND1 and CND2 have the same configuration as that of the capacitor CND1 shown in FIG. 18 or FIG. 19.

Also in this embodiment, the same effects as in the ninth embodiment are obtained.

Eleventh Embodiment

Figure 21:
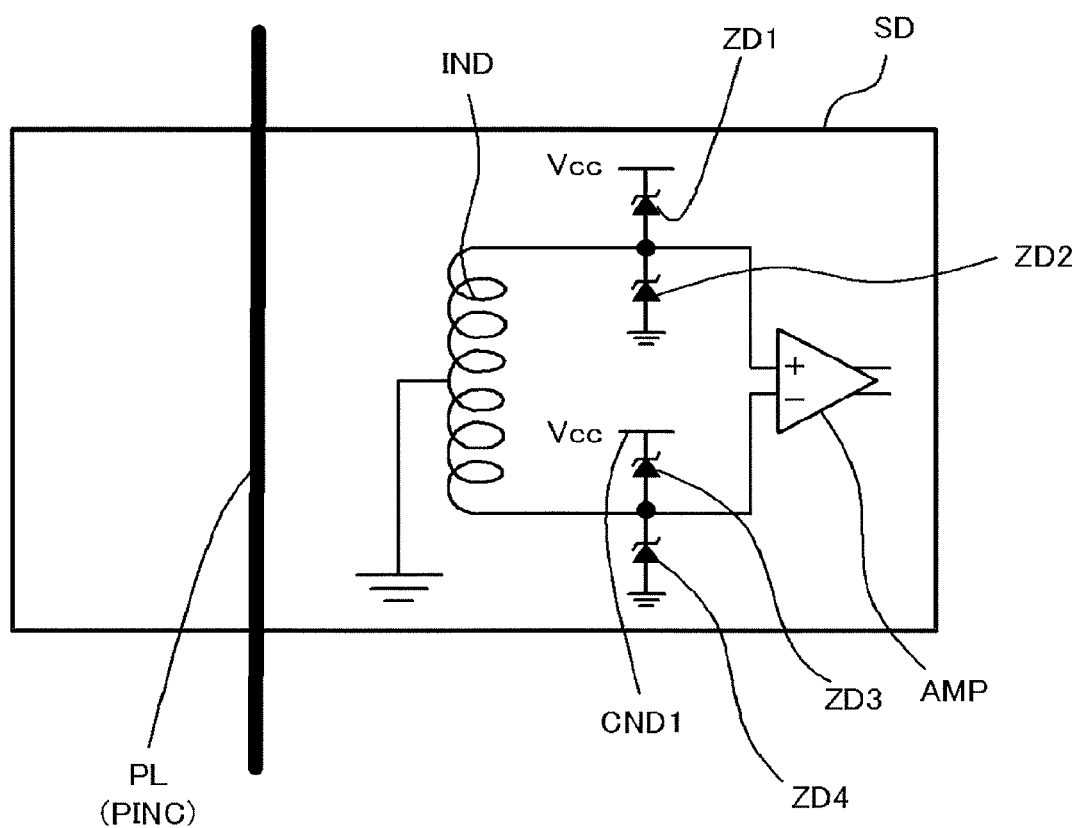
FIG. 21 is a diagram showing main components of an equivalent circuit of a semiconductor device according to an eleventh embodiment.

FIG. 21 is a diagram showing main components of an equivalent circuit of a semiconductor device SD according to an eleventh embodiment. A sensor device SND according to this embodiment has the same configuration as that of the sensor device SND according to the ninth embodiment, except that a protection element of the semiconductor device SD is constituted by a plurality of Zener diodes ZD1, ZD2, ZD3, and ZD4.

The Zener diodes ZD1 and ZD2 (first Zener diode) are connected to each other in series and in opposite directions between a power supply interconnect VCC and a grounding interconnect GND, and the Zener diodes ZD3 and ZD4 (second Zener diode) are also connected to each other in series and in opposite directions between the power supply interconnect VCC and the grounding interconnect GND. An end of an inductor IND is connected between the Zener diodes ZD1 and ZD2, and the other end of the inductor IND is connected between the Zener diodes ZD3 and ZD4. According to such a configuration, also in a case where a large voltage is generated in the inductor IND, a current caused by the voltage can be applied to the power supply interconnect VCC or the grounding interconnect GND through any one of the Zener diodes ZD1, ZD2, ZD3, and ZD4. For this reason, it is possible to prevent an amplification unit AMP from being destroyed.

Figure 22:
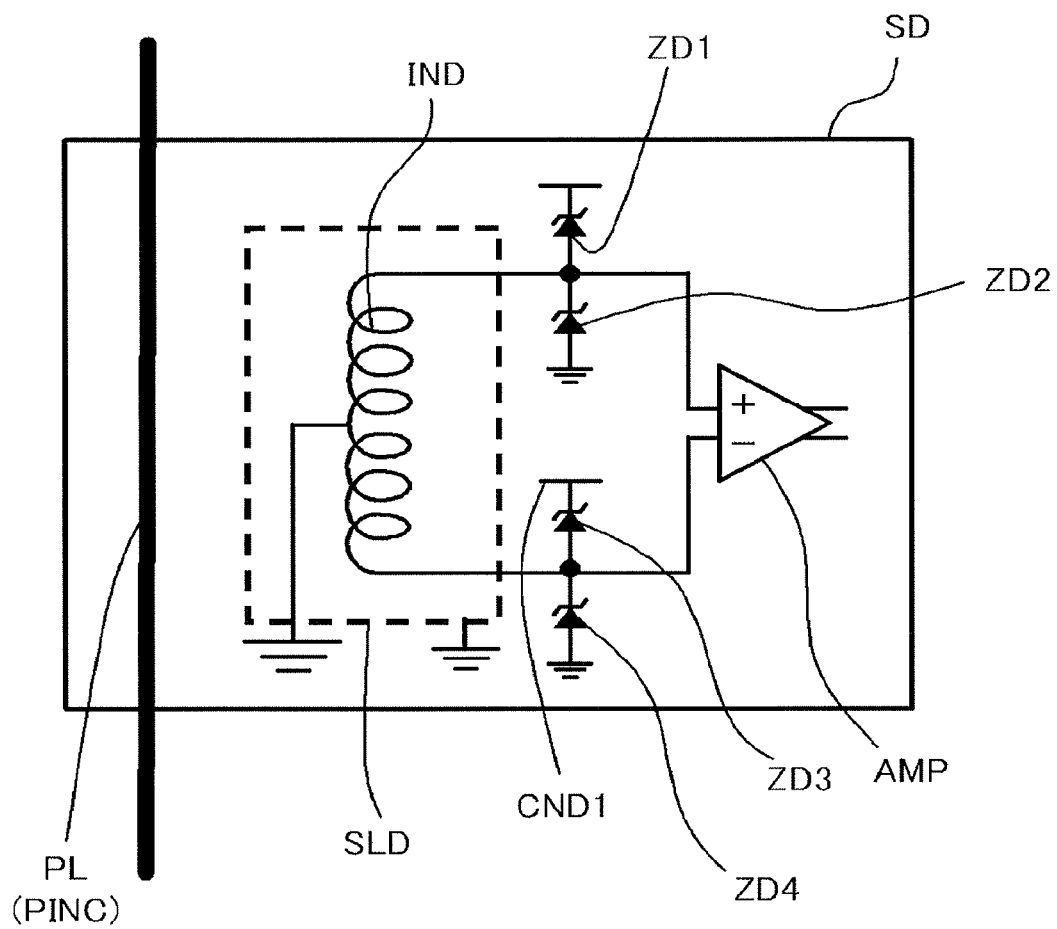
FIG. 22 is a diagram showing a modification example of FIG. 21.

FIG. 22 is a diagram showing a modification example of FIG. 21. This modification example is the same as FIG. 21, except that an inductor IND is surrounded by a shield member SLD.

Figure 23:
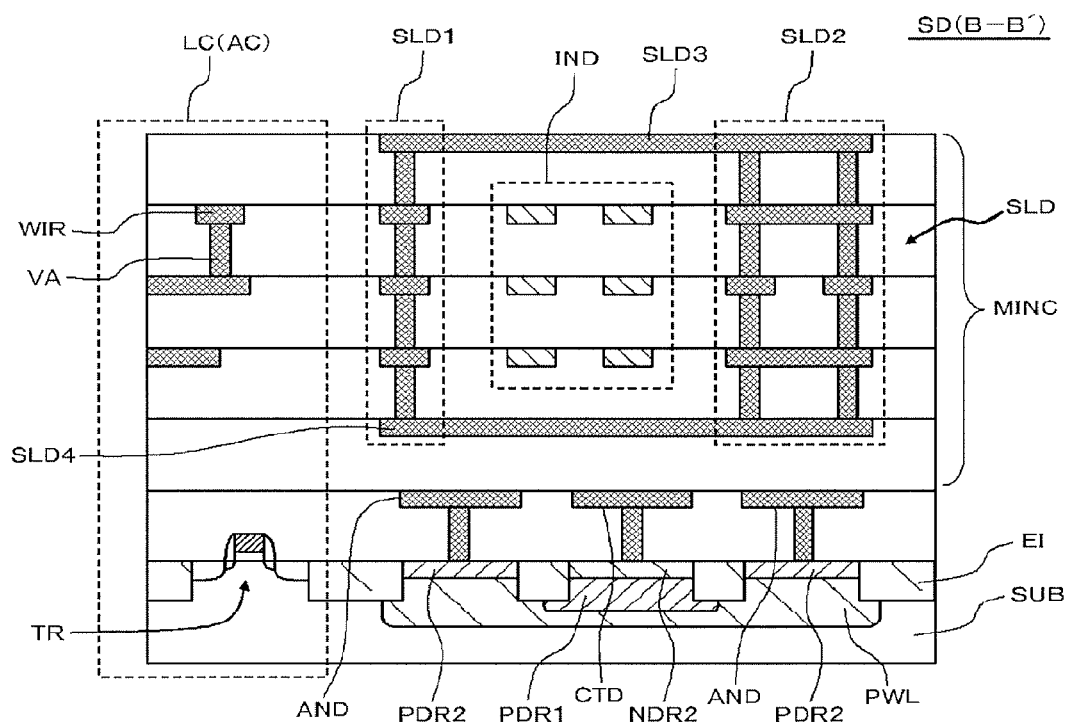
FIG. 23 is a cross-sectional view showing an example of a configuration of a Zener diode.

FIG. 23 is a cross-sectional view showing an example of a configuration of a Zener diode ZD, and corresponds to FIG. 18 according to the tenth embodiment.

In the example shown in this diagram, a fourth shield member SLD4 is located at the second or higher-level interconnect layer from the bottom in a multilayer interconnect layer MINC. An electrode CTD and an electrode AND are formed in a region overlapping a shield member SLD in the lowermost interconnect layer of the multilayer interconnect layer MINC.

In addition, a Zener diode ZD1 (ZD2, ZD3, ZD4) is formed in a region overlapping the shield member SLD in a substrate SUB when viewed in a plan view. The Zener diode ZD1 includes a second conductivity type diffusion region PDR1 formed in the substrate SUB and a first conductivity type diffusion region NDR2 formed in the surface layer of the diffusion region PDR1. In addition, a second conductivity type diffusion region PDR2 is located in the vicinity of the diffusion region NDR2 through an element isolation region EI. A second conductivity type well PWL is formed under the diffusion region PDR2 and the diffusion region PDR1. In other words, the diffusion region PDR2 and the diffusion region PDR1 are formed in the surface layer of the well PWL. The first conductivity type diffusion region NDR2 is connected to the electrode CTD through a contact, and the second conductivity type diffusion region PDR2 is connected to the electrode AND through a contact.

Also in this embodiment, the same effects as in the ninth embodiment are obtained.

As mentioned above, although the invention implemented by the inventors have been specifically described on the basis of the embodiments, the invention is not limited to the embodiments. It will be obvious to those skilled in the art that various changes may be made without departing from the scope of the invention.

It is apparent that the present invention is not limited to the above embodiment, and may be modified and changed without departing from the scope and spirit of the invention.

What is claimed is:

1. A sensor device comprising:
   a first inductor;
   a second inductor;
   a first logic circuit;
   a second logic circuit;
   a first analog circuit; and
   a second analog circuit,
   wherein, in a plan view, the first inductor and the second inductor are arranged side by side in a first direction,
   wherein, in the plan view, the first logic circuit and the second logic circuit are respectively inside a region surrounded by the first inductor and inside a region surrounded by the second inductor,
   wherein, in the plan view, the first analog circuit and the second analog circuit are arranged side by side in a second direction perpendicular to the first direction, and face one another across a region between the first inductor and the second inductor.

2. The sensor device according to claim 1, comprising:
   a semiconductor chip comprising a main surface, a first side, a second side opposite to the first side, a third side between the first side and the second side, and a fourth side opposite to the third side,
   wherein the first inductor, the second inductor, the first logic circuit, the second logic circuit, the first analog circuit, and the second analog circuit are over the main surface of the semiconductor chip,
   wherein the first inductor and the first analog circuit are aligned along the first side,
   wherein the second inductor and the second analog circuit are aligned along the second side,
   wherein the first inductor and the second analog circuit are aligned along the third side, and
   wherein the second inductor and the first analog circuit are aligned along the fourth side.

3. A sensor device comprising:
   a first inductor;
   a second inductor;
   a first logic circuit;
   a second logic circuit; and
   an analog circuit,
   wherein, in a plan view, the first inductor and the second inductor are arranged side by side,
   wherein, in the plan view, the first logic circuit and the second logic circuit are respectively inside a region surrounded by the first inductor and inside a region surrounded by the second inductor, and
   wherein, in the plan view, the analog circuit is between the first inductor and the second inductor.

4. The sensor device according to claim 3, comprising:
   a semiconductor chip comprising a main surface, a first side, a second side opposite to the first side, a third side between the first side and the second side, and a fourth side opposite to the third side,
   wherein the first inductor, the second inductor, the first logic circuit, the second logic circuit and the analog circuit are over the main surface of the semiconductor chip,
   wherein the first inductor is closer to the first side than the second inductor,
   wherein the second inductor is closer to the second side than the first inductor, and
   wherein the first inductor, the analog circuit, and the second inductor are aligned along the third side and the fourth side.

5. A sensor device comprising:
   a first inductor;
   a second inductor;
   a first logic circuit;
   a second logic circuit;
   a first analog circuit; and
   a second analog circuit,
   wherein, in a plan view, the first inductor and the second inductor are arranged side by side,
   wherein, in the plan view, the first logic circuit and the second logic circuit are respectively inside a region surrounded by the first inductor and inside a region surrounded by the second inductor,
   wherein, in the plan view, the first analog circuit and the second analog circuit are respectively inside a region surrounded by the first inductor and inside a region surrounded by the second inductor,
   wherein, in the plan view, the first logic circuit is closer to the second inductor than the first analog circuit, and
   wherein, in the plan view, the second logic circuit is closer to the first inductor than the second analog circuit.

6. The sensor device according to claim 5, comprising:
   a first semiconductor chip comprising a first main surface, a first side, a second side opposite to the first side, a third side between the first side and the second side, and a fourth side opposite to the third side; and
   a second semiconductor chip comprising a second main surface, a fifth side, a sixth side opposite to the fifth side, a seventh side between the fifth side and the sixth side, and an eighth side opposite to the seventh side,
   wherein the first inductor, the first logic circuit, and the first analog circuit are over the first main surface of the first semiconductor chip,
   wherein the second inductor, the second logic circuit, and the second analog circuit are over the second main surface of the second semiconductor chip,
   wherein, in the plan view, the first semiconductor chip and the second semiconductor chip are arranged side by side such that the first side and the fifth side face one another, wherein, in the plan view, the first logic circuit is closer to the first side than the first analog circuit, and wherein, in the plan view, the second logic circuit is closer to the fifth side than the second analog circuit.

* * * * *